United States Patent [19]

Daoud

[11] Patent Number: 4,835,791

[45] Date of Patent: May 30, 1989

[54] SINGLE SIDEBAND SIGNAL GENERATOR

[75] Inventor: Edward D. Daoud, Westminster, Calif.

[73] Assignee: Rockwell International Corporation, El Segundo, Calif.

[21] Appl. No.: 17,125

[22] Filed: Feb. 20, 1987

[51] Int. Cl.[4] .................... H03C 1/52; H04L 27/04
[52] U.S. Cl. ............................... 375/61; 332/45
[58] Field of Search ............... 375/39, 43, 50, 61; 332/44, 45, 48

[56] References Cited

U.S. PATENT DOCUMENTS

| | | | |
|---|---|---|---|
| 3,508,155 | 4/1970 | Voelcker, Jr. | 332/44 |
| 3,793,589 | 2/1974 | Puckette | 332/45 |
| 3,879,661 | 4/1975 | Collins. | |
| 3,918,001 | 11/1975 | Sailer et al. | 332/45 |
| 4,149,039 | 4/1979 | Yuguchi et al. | |
| 4,303,950 | 12/1981 | Taniguchi et al. | |
| 4,326,293 | 4/1982 | DeMan et al. | |
| 4,461,022 | 7/1984 | Slagley. | |
| 4,485,357 | 11/1984 | Voorman. | |
| 4,539,707 | 9/1985 | Jacobs et al. | |
| 4,573,208 | 2/1986 | Jacobs et al. | |
| 4,586,174 | 4/1986 | Wong. | |

*Primary Examiner*—Benedict V. Safourek
*Assistant Examiner*—Wellington Chin
*Attorney, Agent, or Firm*—H. Fredrick Hamann; George A. Montanye; David J. Arthur

[57] ABSTRACT

The method and apparatus disclosed for more efficient use of the bandwidth of a communication channel includes steps of generating a single sideband signal, including inputting a digital signal into an N-tap Hilbert transform filter, modulating the output of the $((N-1)/2)$th tap of the filter onto a first carrier signal, and modulating the output of the Nth tap of the filter onto a second carrier signal. The second carrier signal has the same frequency as, and is separated by 90 degrees in phase from, the first carrier signal. The modulated first and second carrier signals are combined to produce a single sideband signal. A second signal is similarly processed to produce a second single sideband signal. The two single sideband signals may be combined on a single output line. Each single sideband modulation process may be preceded by the steps of receiving an analog signal, sampling the signal to produce a digital signal, and compressing in time the digital signal to produce a compressed signal, wherein each compressed signal is input to the corresponding single sideband signal generator.

5 Claims, 3 Drawing Sheets

SINGLE SIDEBAND SIGNAL GENERATOR

BACKGROUND OF THE INVENTION

A communication channel such as a voice grade telephone line generally has a given capacity of a certain number of signals that it may carry. Demand for communication capabilities has increased substantially in recent years. Attempts to meet this increased demand have included increasing the number of communication channels (which can be very expensive), and increasing the capacity of each communication channel.

Various techniques have been implemented for increasing the capacity of a communication channel. Among these previously-used techniques are increasing the bandwidth of the communication channel, frequency domain multiplexing of the signals, and time domain multiplexing of the signals. Each of these previously-attempted techniques have encountered difficulties and have their drawbacks.

One type of communication channel for which an increase in capacity is frequently desired is a four-wire leased voice grade telephone line. Four-wire leased voice grade telephone lines typically connect two facilities at two different locations, each having a private branch exchange (PBX) as its switching equipment. The bandwidth of a typical leased line is 3.2 kilohertz (kHz), which is suitable for the transmission of a voice signal with a bandwidth of 200 Hz to 3400 Hz.

An object of the present invention is to increase the capacity of a communication channel, not by altering its bandwidth, but by applying two bandwidth-compressed signals to the single communication channel.

Another object of the invention is to modulate two or more signals onto carrier signals for transmission on a single communication channel so that the most important frequency components of the signals are near the center of the bandwidth of the communication channel.

An object of the invention is also to provide an improved single sideband signal generator that generates single sideband signals using less equipment than the prior art.

SUMMARY OF THE INVENTION

The present invention employs amplitude modulation with a suppressed carrier to transmit two or more signals, such as voice signals, over a single communication channel. Separate frequency sub-bands are allocated within the main channel bandwidth for each signal through the implementation of frequency division multiplexing.

The present invention includes a method and apparatus for generating a single sideband signal from an input signal. A digital signal is input into an N-tap Hilbert transform filter. The output of the $((N-1)/2)$th tap is modulated onto a first carrier signal, and the output of the Nth tap is modulated onto a second carrier signal. The second carrier signal has the same frequency as the first carrier signal, and is separated in phase from the first carrier signal by one quarter of a cycle (90°). The modulated first and second carrier signals are combined to produce a single sideband signal.

A second signal may be similarly processed to produce a second single sideband. The two single sideband signals may then be combined on a single output line.

The signals may be compressed prior to the modulation process. The compression step preferably includes receiving an analog signal, sampling the signal to produce a digital signal. The digital signal is compressed in time to reduce its bandwidth and the compressed signal is input to the Hilbert transform filter.

DETAILED DESCRIPTION OF THE PREFERRED EMBODIMENT

The present invention provides an efficient approach for increasing the communication capacity of a four-wire voice-grade leased line telephone system. The invention employs amplitude modulation with a suppressed carrier to transmit two or more voice conversations that have been processed in time to alter their original bandwidths. Separate frequency sub-bands are allocated within the main channel bandwidth for each compressed voice signal through the implementation of frequency division multiplexing (FDM).

Different carrier frequencies are assigned to isolate the multiplexed signals and to eliminate any possible cross-talk between the channels. In the preferred embodiment, two signals are combined by modulating each onto a corresponding sideband of a suppressed carrier. One signal is modulated onto the upper sideband of one carrier frequency, while the other signal is modulated onto the lower sideband, preferably of a slightly different, lower, carrier frequency. The lower frequency components of each of the two modulated signals are placed in the center of the band of the communication channel where no, or minimum, channel degradation is introduced. This is particularly beneficial when the modulated signals are voice signals or other signals in which the lower frequency components are particularly important. This description refers to the signals being processed as voice signals, although it will be apparent that other types of signals may also be processed.

For simplicity of presentation, equations are set forth separately in the Appendix attached hereto.

Figure 1:
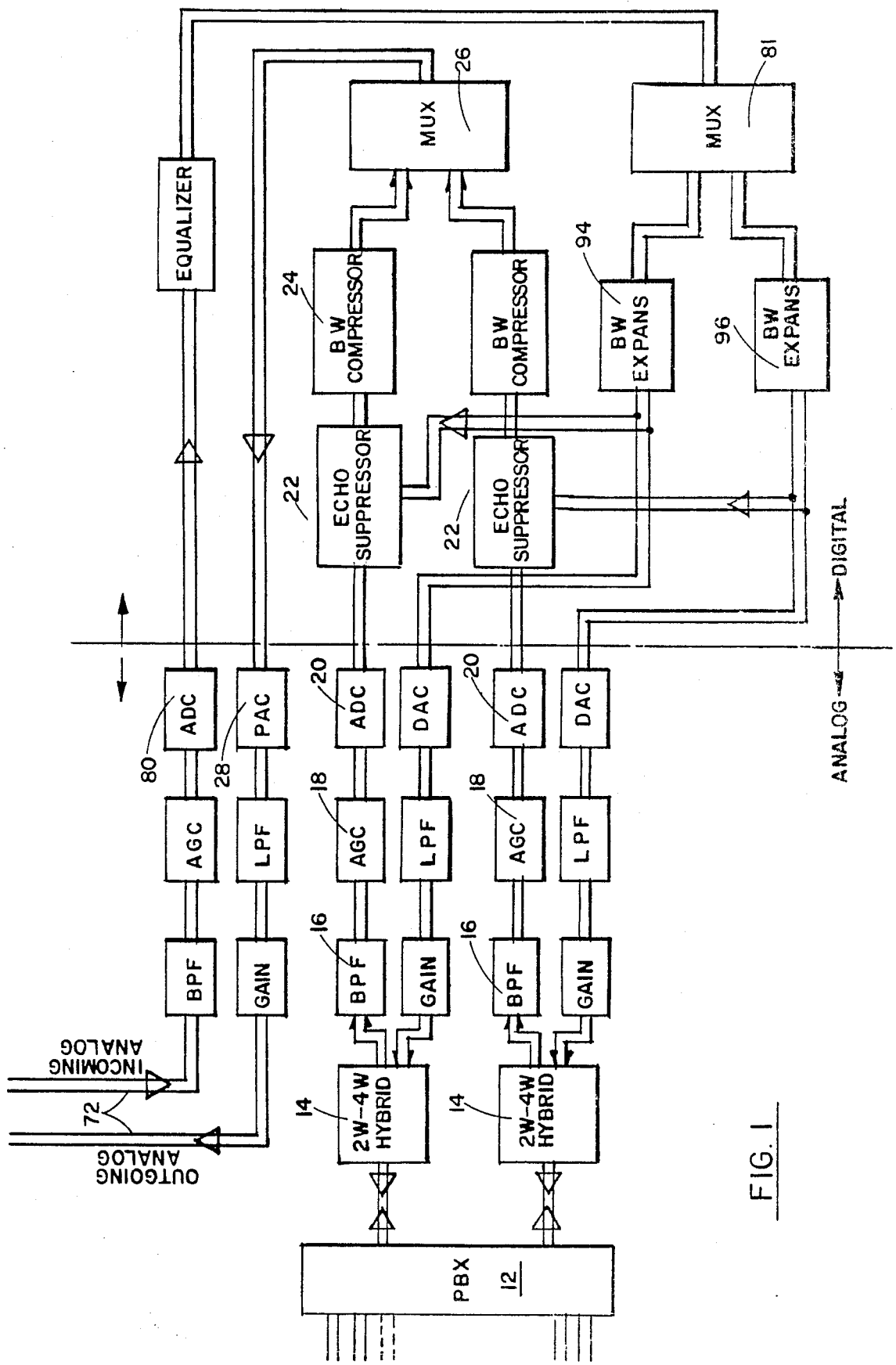
FIG. 1 is a schematic diagram of a system using time domain compression of a speech waveform and including the signal generator and multiplexers of the invention.

FIG. 1 illustrates a block diagram of a voice signal compression and modulation system incorporating as a portion thereof the signal generator and multiplexer of the invention. An outgoing analog signal from a PBX 12 passes through a two-wire/four-wire hybrid device 14 before being band-limited in a bandpass filter (BPF) 16, and then having its gain controlled by an automatic gain control (AGC) 18, to ensure the signal is at the proper level for processing. The bi-directional arrows between the PBX 12 and the two-wire/four-wire hybrid 14 indicate that signals flow in both directions on these lines. The analog signal is sampled in an analog-to-digital converter (ADC) to produce a digital signal. The ADC samples the analog signal at a sampling rate of $F_s$. To ensure the signal is accurately represented in digital form, the bandwidth of the signal is preferably band-limited to have an upper frequency of $F_c$, in which $F_c = F_s/2$.

An echo canceller 22 may be included in a conventional manner. The digitized signal is then compressed in time in a bandwidth compression apparatus 24 to reduce the bandwidth of the signal. In the preferred embodiment, in which two signals are combined onto the single communication channel, the bandwidth is preferably compressed by a factor of two, so the compressed signal has a bandwidth of approximately one-half the bandwidth of the uncompressed signal.

In the described embodiment in which two signals from the PBX are placed on a single communication channel, another signal is also subjected to a process of filtering, digitizing, pitch detection, and bandwidth compression, as described above for the first signal.

MODULATION, SINGLE SIDEBAND GENERATION, AND MULTIPLEXING

After each signal has had its bandwidth altered, separate frequency bands are assigned to each compressed speech waveform so that efficient utilization of the communication channel bandwidth is achieved. The two speech signals are modulated onto carrier signals and combined onto a single communication channel in the multiplexer 26, which includes the modulator and single sideband generator of the invention.

The modulation scheme of the invention is based on generating a single sideband (SSB) suppressed carrier signal from the frequency division multiplexed spectral components of each voice signal.

Figure 2:
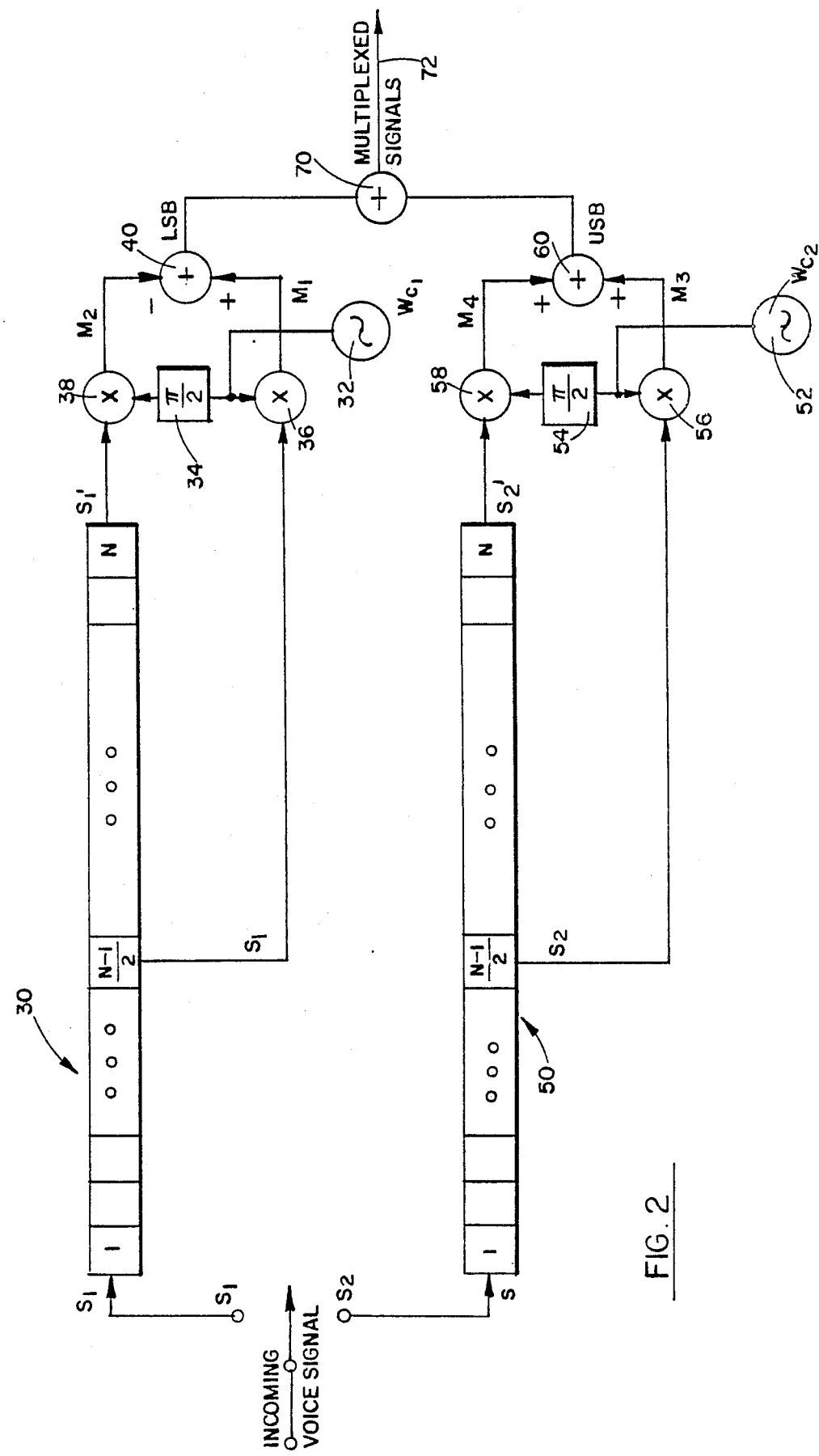
FIG. 2 is a block diagram of the modulation device for single sideband generation for generating the frequency multiplexed signals.

The modulation and single sideband generation scheme is illustrated in FIG. 2. The compressed speech waveform $s(n)$ is used to generate a second signal $s'(n)$ by a simple filtering operation. The filter used is a digital Hilbert transform filter 30. Using such a filter, a convolution relation exists between $s(n)$ and $s'(n)$, which is given by Equation (1). The convolution relation between $s(n)$ and $s'(n)$ can also be expressed as Equation (2). Equation (2) defines an ideal digital Hilbert Transform filter.

In the lower half of the unit circle ($\pi \leq w < 2\pi$), the signal sum $r(n) = s(n) + js'(n)$ is zero. This is also expressed in the form of Equation (3). Therefore, the signal $r(n)$ is an analytical signal.

In the preferred embodiment of the invention, a 51-tap Hilbert transform filter is used. As is recognized by those skilled in the art, the output of a Hilbert transform filter is equivalent to a 90-degree phase shift of all frequency components of the signal within the specified bandwidth. To achieve a 90-degree phase difference between the signal $s(n)$ and $s'(n)$ with a proper alignment of their spectral components, the signal $s'(n)$ is output from the last (Nth) tap of the Hilbert transform filter, as shown in FIG. 2. An output $s(n)$ is also taken off the $((N-1)/2)$th tap of the Hilbert transform filter.

Each of the signals output from the Hilbert transform filter is modulated onto a carrier signal. The carrier signals are preferably 90 degrees apart in phase, and have the same frequency. As shown in FIG. 2, a sinusoidal signal generator 32 may supply the carrier signal, which is then applied to the two transform filter output signals with a phase-delay element 34, causing the carrier signal applied to the output of the Nth tap of the filter $s'(n)$ to be delayed by 90 degrees with respect to the carrier signal applied to the output of the $((N-1)/2)$th tap $s(n)$.

A multiplexer 36 modulates the output of the $((N-1)/2)$th tap of the Hilbert transform filter 30 onto the carrier signal of frequency $w_{c1}$ generated by the carrier signal generator to produce a first modulated signal $M_1$. A multiplexer 38 modulates the output of the Nth tap of the filter onto the carrier signal of frequency $w_{c1}$, generated by the signal generator and shifted 90° in phase, to produce a second modulated signal $M_2$. The modulated signals $M_1$ and $M_2$ are either added or subtracted in a summer 40 to produce the single-sideband output signal. In the illustrated embodiment, the first sideband generator produces the lower sideband (LSB) signal by subtracting the second modulated signal $M_2$ from the first modulated signal $M_1$. The mathematics for the modulated signals $M_1$ and $M_2$ and the sideband generation are provided in Equations (4)–(8) in the Appendix.

A second, parallel, single sideband generator can be used to produce an upper sideband signal from a second input signal. This second single sideband generator is essentially the same as the first generator. It includes a single N-tap Hilbert transform filter 50 having outputs at its $((N-1)/2)$th and Nth taps. The output of the $((N-1)/2)$th tap is modulated onto a second carrier signal of frequency $w_{c2}$ generated by the second carrier signal generator 52 to produce a third modulated signal $M_3$. The output of the Nth tap of the filter is modulated onto the second carrier signal of frequency $w_{c2}$ generated by the second signal generator and shifted 90° in phase, to produce a fourth modulated signal $M_4$. In the illustrated embodiments, the third and fourth modulated signals $M_3$ and $M_4$ are added together in the summer 60 to produce the upper sideband (USB) signal. The mathematics for the modulated signals $M_3$ and $M_4$ and the USB generation are provided in Equations (9)–(13) in the Appendix.

The two sideband signals can then be combined in a multiplexing summer 70 so that the two input signals $s_1(n)$ and $s_2(n)$ are multiplexed on to a single communication channel 72.

Preferably the frequency of the second carrier signal $w_{c2}$ used in the upper sideband generator is slightly higher than the frequency of the first carrier signal $w_{c1}$ used in the lower sideband generator, so there is a frequency gap between the lower sideband signal and the upper sideband signal. This gap essentially eliminates the possibility of cross-talk between the two signals. In a typical voice grade telephone line communication channel, a gap of approximately 200 Hz is sufficient to prevent such cross-talk while not significantly detracting from the usable bandwidth of the communication channel.

Caution should be exercised to ensure that the low frequency components of $s_1(n)$ and $s_2(n)$ are in the center of the 3.2 kHz bandwidth allowed by the communication channel, to avoid any degradation in the signals as they are transmitted along the communication channel.

It is preferred that at least 45 db suppression of the unwanted sideband be implemented to enable the accurate generation of a single sideband with minimal filtering and no stringent requirements.

For transmission on a telephone line, the multiplexed signal is converted into an analog signal in a digital-to-analog converter 28 and further processed for transmission in a manner that is typical for signals being transmitted over telephone lines.

RECEPTION AND DEMULTIPLEXING

The reception of the multiplexed signals may be accomplished using any of a number of techniques. Coherent, or synchronous, demodulation may be implemented. However, synchronous detection requires that the carrier phase and frequency information be available at the receiver. This deficiency, however, can be avoided by employing the concept of a channel identification (ID) tone that may be implemented in the present system.

Figure 3:
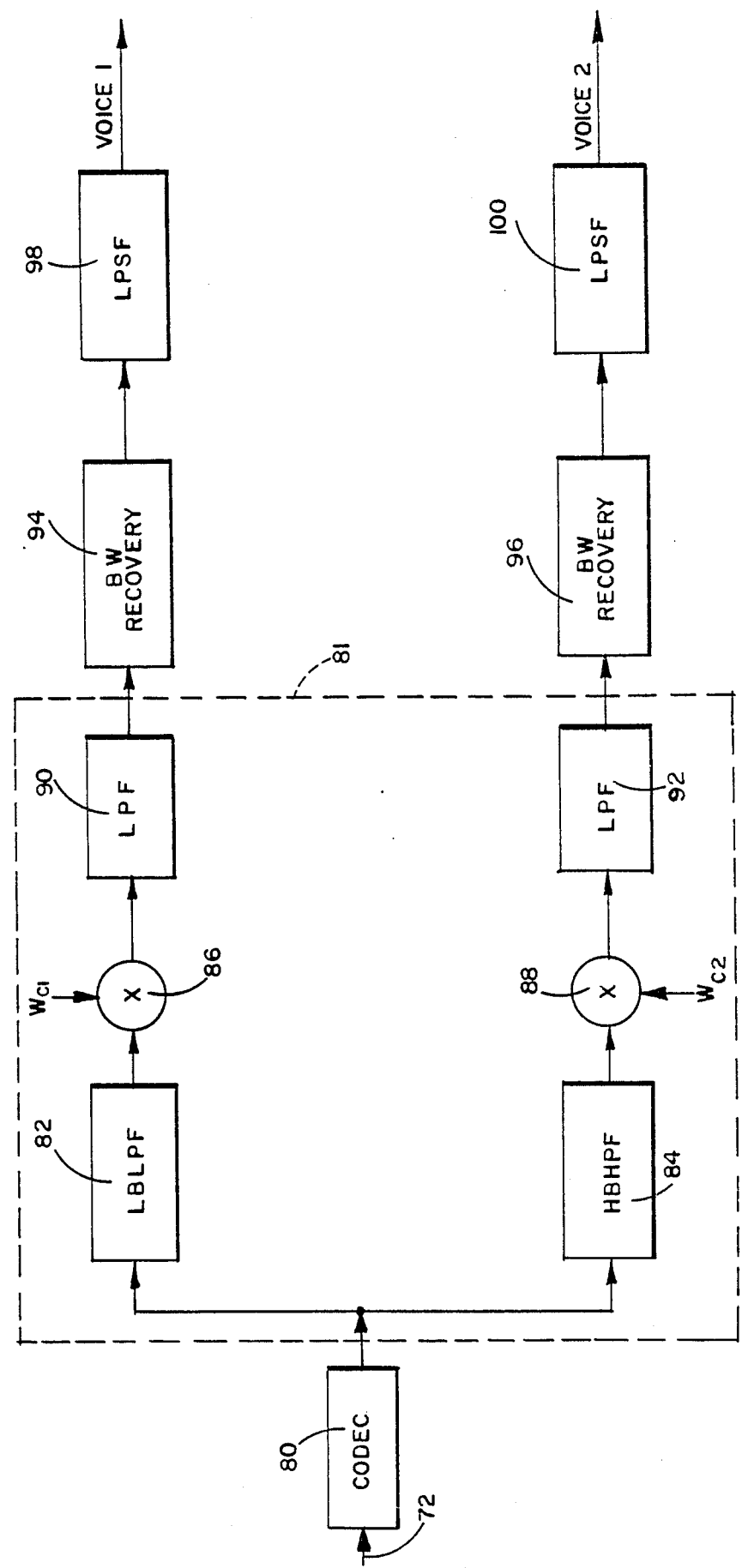
FIG. 3 is a block diagram of the demodulation and baseband generation system used with the invention.

At the receiver, the analog multiplexed signal on the communication channel 72 is first digitized into a serial bit stream of data, using the analog-to-digital converter (CODEC) 80 shown in FIG. 3. Two digital band-split filters 82, 84 are used to separate the upper sideband from the lower sideband spectralcomponents of the signal. A low-band, low-pass filter (LBLPF) 82 passes the lower sideband spectral components, while a high-band, high-pass filter (HBHPF) 84 passes the upper sideband spectral components. The demodulation process is then performed on each signal separately to generate two baseband signals in compressed form.

A frequency convolution is performed on each signal to generate a spectral representation consisting of the sum of the spectral components of the baseband compressed voice signal and the spectral components of a modulated signal centered at twice the carrier frequency. This convolution for each sideband is expressed mathematically in Equation 14 in the Appendix.

Each modulated signal is demodulated by multiplying it by a signal the same as its carrier signal. The lower sideband signal passed by the low-band, low-pass filter 82 is combined in a multiplier 86 with a sinusoidal signal of frequency $w_{c1}$, which is the same as the carrier signal generated by the carrier signal source 32. Similarly, the upper sideband signal passed by the high-band, high-pass filter 84 is combined in a multiplier 88 with a sinusoidal signal of frequency $W_{c2}$, which is the same as the carrier signal generated by the carrier signal source 52.

Each modulator 86, 88 produces its respective baseband signal and some frequency components centered at twice the carrier frequency. Low-pass filters 90, 92 filter out the components centered at twice the carrier frequency, leaving just the baseband signal on the signal path.

The bandwidth compression process that was performed initially on the signal is performed in reverse in a bandwidth recovery device 94, 96 on each received compressed signal to expand the bandwidth and recover the initial signal.

A smoothing filter 98, 100 on each signal path passes the expanded spectral components of the baseband voice signal.

Each signal path then outputs a reconstructed voice signal like one of the voice signals input to the transmitter. Two voice signals are therefore simultaneously transmitted across a single communication channel of conventional bandwidth.

APPENDIX $$s'(n) = \frac{2}{\pi} \cdot s(n - m) \frac{\sin^2(m/2)}{m} \quad (1)$$

$$s'(n) = s(n)*h(n) \quad (2)$$

where:

$$h(n) = \begin{cases} \frac{\sin^2(\pi n/2)}{\pi n/2} & n \neq 0 \\ 0 & n = 0 \end{cases}$$

$$V(e^{jw}) = 0 \quad \pi \leq w \leq 2\pi \quad (3)$$

$$M_1 = s(t) \cos w_{c1} t \quad (4)$$

wherein:
s(t) is the analog representation of s(n) for convenience; and
$w_{x1}$ is the frequency of the first carrier signal.

$$M_1 \rightleftharpoons \tfrac{1}{2}[S(w_{c1}+w_{s1})+S(w_{c1}-w_{s1})] \quad (5)$$

wherein:
S(w) is the spectral representation of s(n);
$w_{c1}$ is the frequency of the first carrier signal; and
$w_{s1}$ is the frequency of the first input signal $s_1(n)$.

$$M_2 = s'(t) \sin w_{c1} t \quad (6)$$

wherein:
s'(t) is the analog representation of s'(n) for convenience; and
$w_{c1}$ is the frequency of the first carrier signal.

$$M_2 \rightleftharpoons \tfrac{1}{2}[S(w_{c1}+w_{s1})+S(w_{c1}-w_{s1})] \quad (7)$$

wherein:
S(w) is the spectral representation of s(n);
$w_{c1}$ is the frequency of the first carrier signal; and
$w_{s1}$ is the frequency of the first input signal $s_1(n)$.

$$(M_1-M_2) \rightleftharpoons S(w_{c1}-w_{s1}) \quad (8)$$

$$M_3 = s(t) \cos w_{c2} t \quad (9)$$

wherein:
s(t) is the analog representation of s(n) for convenience; and
$W_{c2}$ is the freuency of the second carrier signal.

$$M_3 \rightleftharpoons \tfrac{1}{2}[S(w_{c2}+w_{s2})+S(w_{c2}-w_{s2}I] \quad (10)$$

wherein:
S(w) is the spectral representation of s(n);
$W_{c2}$ is the frequency of the second carrier signal; and
$W_{s2}$ is the frequency of the second input signal $s_2(n)$.

$$M_4 = s'(t) \sin w_{c2} t \quad (11)$$

wherein:
s'(t) is the analog representation of s'(n) for convenience; and
$w_{c2}$ is the frequency of the second carrier signal.

$$M_4 \rightleftharpoons \tfrac{1}{2}[S(w_{c2}+w_{s2})-S(w_{c2}-w_{s2})] \quad (12)$$

wherein:
S(w) is the spectral representation of s(n);
$w_{c2}$ is the frequency of the second carrier signal; and
$w_{s2}$ is the frequency of the second input signal $s_2(n)$.

$$(M_3+M_4) \rightleftharpoons S(w_{c2}+w_{s2}) \quad (13)$$

$$S(w_s+w_c)*F(w_c) = S(w_s) + S(2.w_c+w_s) \quad (14)$$

wherein * denotes frequency convolution.

I claim:
1. A single sideband signal generator comprising:
a generator input for receiving an input digital signal;

a Hilbert transform filter having N taps and having its input connected to said generator input;

a first modulator for combining the output of the $((N-1)/2)$th tap of said Hilbert transform filter with a first carrier signal to produce a first modulated signal; and a second modulator for combining the output of the Nth tap of said Hilbert transform filter with a second carrier signal to produce a second modulated signal, wherein said second carrier signal has the same frequency as said first carrier signal and is separated in phase from said first carrier signal by ninety degrees.

2. The single sideband signal generator of claim 1 additionally comprising:

a signal generator for generating said first carrier signal, wherein said first modulator is connected to the output of said signal generator; and a delay having its input connected to the output of said signal generator for delaying said first carrier signal one-quarter of its period to generate said second carrier signal.

3. The single sideband signal generator of claim 1, additionally comprising:

a signal combiner connected to the outputs of said first and second modulators for combining said first and second modulated signals to produce a single sideband output signal.

4. A method of generating a single sideband signal, comprising:

receiving an input digital signal;

inputting said signal into a Hilbert transform filter having N taps and having outputs at its $((N-1)/2)$th and Nth taps;

modulating the output of said $((N-1)/2)$th tap onto a first carrier signal;

modulating the output of said Nth tap onto a second carrier signal, wherein said second carrier signal has the same frequency as said first carrier signal and is separated in phase from said first carrier signal by ninety degrees; and combining the modulated first and second carrier signals to produce a single sideband signal.

5. A single sideband signal generator comprising:

a generator input for receiving a first input digital signal;

a signal generator for generating said first carrier signal, wherein said first modulator is connected to the output of said signal generator; and a delay having its input connected to the output of said signal generator for delaying said first carrier signal one-quarter of its period to generate said second carrier signal;

a Hilbert transform filter having N taps and having its input connected to said first generator input;

a first modulator having a first input coupled to the output of the $((N-1)/2)$th tap of said Hilbert transform filter and a second input coupled to said carrier signal for combining the output of said $((N-1)/2)$th tap of said Hilbert transform filter with said first carrier signal to produce a first modulated signal;

a second modulator having a first input coupled to said Nth tap of said Hilbert transform filter and a second input coupled to said second carrier signal for combining the output of said Nth tap of said Hilbert transform filter with said second carrier signal to produce a second modulated signal; and a signal combiner connected to the outputs of said first and second modulators for combining said first and second modulated signals to produce a single sideband output signal.

* * * * *